United States Patent [19]

Tanimoto et al.

[11] Patent Number: 4,687,322

[45] Date of Patent: Aug. 18, 1987

[54] PROJECTION OPTICAL APPARATUS

[75] Inventors: Akikazu Tanimoto, Yokohama; Shoji Ishizaka, Kawasaki; Yutaka Endo; Hiroyuki Suzuki, both of Tokyo; Masamitsu Yanagihara, Kawasaki, all of Japan

[73] Assignee: Nippon Kogaku K. K., Tokyo, Japan

[21] Appl. No.: 931,013

[22] Filed: Nov. 17, 1986

Related U.S. Application Data

[63] Continuation of Ser. No. 826,979, Feb. 7, 1986, abandoned.

[30] Foreign Application Priority Data

Feb. 12, 1985 [JP] Japan ................................. 60-24601

[51] Int. Cl.⁴ ............................................. G03B 27/52
[52] U.S. Cl. ....................................... 355/55; 355/30; 355/43; 355/53
[58] Field of Search ....................... 355/30, 41, 43, 45, 355/53, 55; 354/400; 353/101, 121, 122

[56] References Cited

U.S. PATENT DOCUMENTS

| | | | |
|---|---|---|---|
| 4,357,100 | 11/1982 | Mayer et al. | 355/43 X |
| 4,503,335 | 3/1985 | Takahashi | 355/30 X |
| 4,506,977 | 3/1985 | Sato et al. | 355/55 X |
| 4,540,278 | 9/1985 | Phillips | 355/55 |
| 4,561,773 | 12/1985 | Sato | 355/43 |
| 4,564,284 | 1/1986 | Tsutsui | 355/30 |
| 4,583,840 | 4/1986 | Yabu et al. | 355/30 |
| 4,592,650 | 6/1986 | Tabarelli et al. | 355/43 X |
| 4,595,282 | 6/1986 | Takahashi | 355/53 |
| 4,600,282 | 7/1986 | Yamamura et al. | 353/122 |
| 4,601,560 | 7/1986 | Isohata et al. | 353/122 |

FOREIGN PATENT DOCUMENTS

56-42205  4/1981  Japan .

*Primary Examiner*—Richard A. Wintercorn
*Attorney, Agent, or Firm*—Shapiro and Shapiro

[57] ABSTRACT

An apparatus for forming the optical image of a photopattern placed on a first plane on a second plane comprises projection means having a projection optical system disposed between the first plane and the second plane to form the optical image, focus detecting means including means for detecting the position of the second plane relative to the projection optical system, the in-focus position corresponding to the position of the second plane when the imaging plane of the projection optical system and the second plane are coincident with each other being preset, the focus detecting means putting out a detection signal when the in-focus position is detected by the detecting means, fluctuation detecting means for determining the amount of fluctuation of the imaging plane of the projection optical system caused correspondingly to a variation in the refractive index of the atmosphere, and means responsive to the fluctuation detecting means to control the focus detecting means so that the in-focus position is re-set correspondingly to the amount of fluctuation of the imaging plane determined by the fluctuation detecting means.

22 Claims, 9 Drawing Figures

PROJECTION OPTICAL APPARATUS

This is a continuation application of Ser. No. 826,979 filed Feb. 7, 1986, which is now abandoned.

BACKGROUND OF THE INVENTION

1. Field of the Invention

This invention relates to an apparatus provided with a projection optical system, and in particular to a projection optical apparatus in an exposure apparatus for the manufacture of semiconductor elements which controls the projected pattern image of a mask to a desired projected state irrespective of a variation in the optical characteristic of the projection optical system.

2. Description of the Prior Art

Reduction projection type exposure apparatuses have recently become indispensable for the production of super LSI. In the exposure apparatus of this type, use is usually made of a projection lens for reduction-projecting the circuit pattern on a negative (equivalent to a mask) called a reticle onto a semiconductor wafer at a reduction rate of 1/5 or 1/10 and obtaining a resolved image having a line width of 1 $\mu$m or more. At present, development of a projection lens which increases its resolving power while keeping a great projection exposure area is advanced to improve the productivity of semiconductor elements. To obtain a higher resolving power, the numerical aperture (N.A.) of the projection lens must be made great, but this necessarily results in a shallow depth of focus.

In order to cope with a variation in the thickness of a wafer on which the formation of a pattern (lithography) is effected and the unevenness of the surface of the wafer, a focus detector utilizing a gap sensor for detecting the spacing between the projection lens and the wafer is incorporated in the exposure apparatus of this type, and on the basis of the detection signal thereof, the automatic focusing for bringing the imaging plane of the projection lens (the image plane of the projected pattern) and the surface of the wafer into coincidence with each other is effected. The depth of focus for obtaining predetermined pattern line width accuracy becomes smaller as the minimum pattern to be transferred is smaller, and where a pattern of line and space of 1 $\mu$m is to be transferred, the depth of focus is of the order of ±1 $\mu$m.

Now, in the projection optical path from the reticle to the wafer, air more or less freely goes into and out of the space between the reticle and the projection lens, the space between a plurality of lens elements in the projection lens and the space between the projection lens and the wafer. The refractive index of air varies dependently of the atmospheric pressure and therefore, the fact that air goes into and out of the projection optical path means that the phenomenon of the imaging plane of the projection lens being fluctuated in the direction of the optic axis by a variation in the atmospheric pressure, i.e., so-called focus fluctuation, is brought about.

Heretofore, it has not been recognized that focus fluctuation is caused by a variation in the atmospheric pressure, but some drift caused solely in the focus detector has been considered to be the cause of focus fluctuation. Therefore, in the production field where the exposure apparatus is handled, at the commencement of daily work, a pattern has been printed on trial on a wafer and the focus detector has been adjusted so that it is judged as the in-focus at such a wafer position that a predetermined resolved image (line width) is obtained. It takes much time and labor to effect the confirmation and adjustment of the focus position by such a method and thus, the throughput of the apparatus is reduced. Moreover, the atmospheric pressure is not constant during the operation of the apparatus, but fluctuates more or less. Therefore, even if the focus detector is adjusted once a day, accurate focusing is effected only by the atmospheric pressure at that point of time. Particularly, when a typhoon or a hurricane whose atmospheric pressure varies locally passes the district in which the production field lies, considerably great focus fluctuation occurs. Moreover, depending on the scale or the course of the typhoon or the hurricane, a variation of the order of 20–30 mmHg in the atmospheric pressure may occur within a very short time (say, about an hour). So, the amounts of fluctuation of the focuses of various projection lenses by a variation in the atmospheric pressure have been actually measured by an experiment or in the field, and as a result, it has been found that in projection lenses of a certain type of structure, the amount of fluctuation of the focus sensitively changes relative to a variation in the atmospheric pressure and that amount itself greatly exceeds the practical depth of focus.

SUMMARY OF THE INVENTION

It is an object of the present invention to solve the above-noted problems and to provide a projection optical apparatus in which focusing can always be accomplished well.

The projection optical apparatus of the present invention has its technical essential point in that the output of a pressure sensor for measuring the atmospheric pressure is used to detect the amount of fluctuation of the imaging plane of a projection system (the amount of fluctuation of the focus) caused by a variation in the refractive index of the atmosphere attributable to the fluctuation or the like of the atmospheric pressure and offset is applied to correct the position detected as the infocus by a focus detector, by the amount of fluctuation.

DESCRIPTION OF THE PREFERRED EMBODIMENTS

Figure 1:
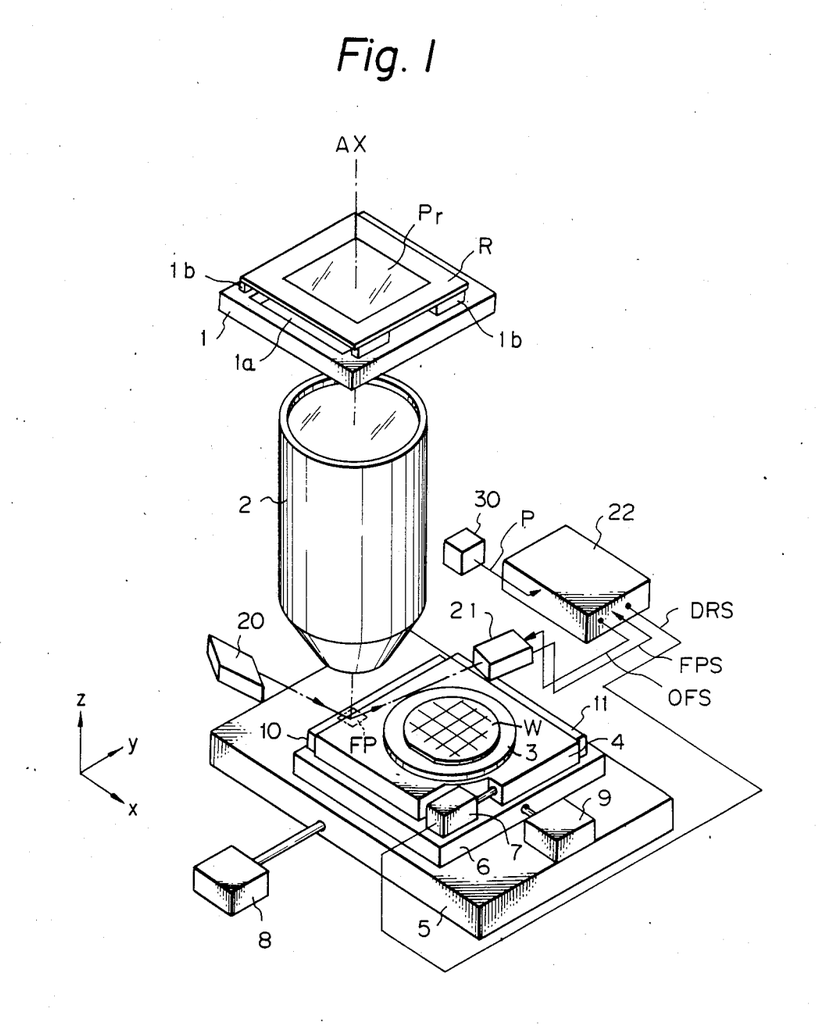
FIG. 1 is a perspective view showing the construction of a reduction projection type exposure apparatus according to an embodiment of the present invention.

FIG. 1 schematically shows the general construction of a reduction projection type exposure apparatus (so-called stepper) according to an embodiment of the present invention.

A reticle R on which a circuit pattern or the like is depicted is placed on a reticle stage 1. The reticle state 1 is formed with an opening 1a through which a pattern imaging light passed through the pattern area Pr of the reticle R may enter a projection lens 2. Further, the reticle stage 1 is provided with holding portions 1b for vacuum-adsorbing the marginal portion of the reticle R, and the reticle stage 1 adsorbs the reticle R and is finely moved in x-direction and y-direction to thereby position the reticle R so that the center of the reticle R becomes coincident with the optic axis AX of the projection lens 2. A two-dimensionally movable stage inherent to the stepper is provided below the projection lens 2. A wafer W as a substrate to be projected is vacuum-adsorbed on a wafer chuck 3 which is provided on a Z stage 4 vertically movable in the direction of the optic axis AX of the projection lens 2 (Z-direction). This Z stage 4 is provided on an X stage 6 movable in x-direction on a Y state 5 movable in y-direction and is vertically movable by a motor 7. Motors 8 and 9 one-dimensionally drive the Y stage 5 and the X stage 6, respectively. Mirrors 10 and 11 for a laser interference measuring machine for detecting the coordinates positions of the stages are provided on the x-direction and y-direction side edges of the Z stage 4.

Now, when the reticle R is illuminated by an illuminating optical device, not shown, the pattern image in the pattern area Pr is formed on the imaging plane EP of the projection lens 2. There are provided a projector 20 and a light receiver 21 as a gap sensor (focus detector) for detecting the positional relation between the imaging plane EP and the surface of the wafer W, i.e., the spacing between the projection lens 2 and the wafer W. The projector 20 obliquely projects a slit imaging light which is imaged on the imaging plane EP, and the light receiver 21 receives the reflected light of the slit imaging light from the wafer W positioned on the imaging plane EP and detects the Z-direction position of the wafer (the spacing between the projection lens 2 and the wafer W).

The basis of the focus detector for obliquely applying a slit-shaped or rectangular light beam onto the wafer W in this manner is disclosed in Japanese Laid-open Patent Application No. 42205/1981, and an improvement thereof is proposed in U.S. application Ser. No. 667,890 filed on Nov. 2, 1984. The light receiver 21 synchronously rectifies the photoelectric signal of the reflected light from the wafer W, thereby putting out a focus signal FPS indicative of the surface position of the wafer W. Since this focus signal FPS is a synchronously rectified signal, it has an S curve characteristic similar to the output characteristic of a photoelectric microscope or the like.

The focus signal FPS is input to a control circuit 22 for focusing. On the basis of the focus signal FPS, the control circuit 22 puts out a signal DRS for servo-controlling the motor 7 for vertically moving the Z stage 4. Therefore, the surface of the wafer W is adjusted to a level at which the focus signal FPS represents the in-focus.

However, in the above-described construction, the Z-direction position detected as the in-focus by the focus detector is mechanically determined so as to be a predetermined interval from the projection lens 2 during the manufacture of the apparatus and therefore, when a fluctuation of the focus occurs, the surface of the wafer W will deviate from the imaging plane FP even if the projection lens is adjusted to the in-focus state by the focus signal FPS.

So, in the present embodiment, there is provided a pressure sensor 30 for detecting the atmospheric pressure at an absolute value and there is also provided a correction control portion for inputting the information of the atmospheric pressure to the control circuit 22 and calculating the amount of fluctuation of the focus and putting out to the focus detector an offset signal OFS which corrects the level of the surface of the wafer detected as the infocus by the focus detector by the calculated amount of fluctuation.

The correction may be accomplished by an electrical method in which an offset voltage is applied to the focus signal FPS itself or an offset voltage is applied to the slice level in a case where the focus signal FPS is compared by a comparator or the like, or by a mechanical method in which offset is applied to the optical arrangement of an optical member in the projector 20 or the light receiver 21. In the present embodiment, however, in view of the fact that a relatively great amount of offset is obtained and the output characteristic (S curve wave form) of the focus signal FPS shifts simply in Z-direction, use is made of the latter method in which offset is applied to the optical arrangement.

Figure 2:
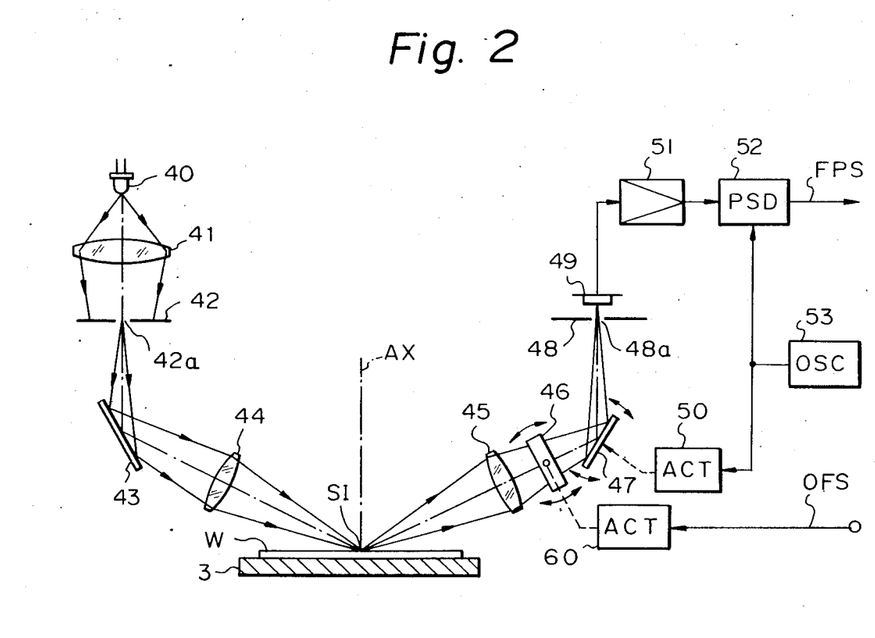
FIG. 2 shows the specific construction of a focus detecting system.

FIG. 2 shows the optical construction and circuit connection of the focus detector of the present embodiment. In FIG. 2, it is to be understood that the imaging plane FP and the surface of the W are coincident with each other. A light emitted from a light-emitting diode (LED) 40 and having a wavelength which does not sensitize the photoresist on the wafer is condensed by a condenser lens 41, and illuminates a slit plate 42 having an elongated rectangular slit 42a. The light transmitted through the slit 42a is reflected by a mirror 43, is converged by a reduction lens 44 and is imaged as the optical image SI of the slit 42a on the surface of the wafer W near the optic axis AX. The LED 40, the condenser lens 41, the slit plate 42, the mirror 43 and the reduction lens 44 together constitute the projector 20 of FIG. 1.

The reflected light from the wafer W is directed to a slit plate 48 through an enlarging lens 45, a parallel flat glass plate (plane parallel) 46 and a vibratory mirror 47, and an enlarged image of the optical image SI is formed on the slit plate 48. The slit plate 48 is provided with a slit 48a parallel to the enlarged image, and the light transmitted through the slit 48a is received by a photoelectric detector 49. The vibratory mirror 47 is driven by an actuator 50 so that the enlarged image of the optical image SI effects simple harmonic motion on the slit plate 48 in a direction orthogonal to the lengthwise direction of the slit 48a. The photoelectric signal from the photoelectric detector 49 is amplified by an amplifier 51, whereafter it is input to a synchronous rectification (synchronous detection) circuit (hereinafter referred to as PSD) 52. PSD 52 receives as an input the reference frequency signal from an oscillator (hereinafter referred to as OSC) 53 which determines the oscillation frequency of the vibratory mirror 47, and synchronously rectifies the photoelectric signal by that signal, thereby putting out a focus signal FPS.

The plane parallel 46 is provided in the condensing system rearward of the enlarging lens 45 and is rotatable in a certain range of angle by an actuator 60. By the rotation (inclination) of this plane parallel 46, the center of vibration of the enlarged image of the optical image SI formed on the slit plate 48 is shifted in a direction orgthogonal to the lengthwise direction of the slit 48a (the left-to-right direction in the plane of the drawing sheet of FIG. 2). The shift of the center of vibration relative to the slit 48a is equivalent to the shift in Z-direction of the position of the wafer W when the focus signal FPS is judged as the in-focus (the zero point on the X curve wave form). In the present embodiment, correction of the fluctuation of the focus is accomplished by the plane parallel 46 and the actuator 60.

Figure 3:
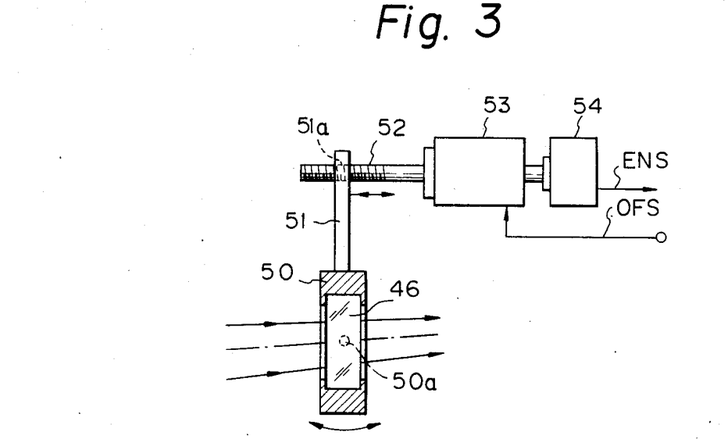
FIG. 3 is a partial cross-sectional view showing a rotating mechanism for a plane parallel.

FIG. 3 shows the specific constructions of the plane parallel 46 and the actuator 60. The plane parallel 46 is held by a holder 50 having the center of rotation 50a perpendicular to the plane of the drawing sheet, and a lever 51 is fixed to the holder 50. An internal thread 51a is formed in the end portion of the lever 51, and a male screw 52 rotatable by the drive of a motor 53 is threadably engaged with the internal thread 51. The amounts of rotation of the motor 53 and the male screw 52 are read by a rotary encoder 54.

In such a construction, when the motor 53 is driven, the plane parallel 46 is rotated about the center 50a, and the angle of rotation (the amount of inclination) thereof can be calculated from the value read by the rotary encoder 54, the pitch of the male screw 52 and the length of the lever 51 (exactly, the length from the internal thread 51a to the center 50a). The pitch of the male screw 52 and the length of the lever 51 are constant and therefore, after all, if only the value read by the rotary encoder 54 is known, the angle of rotation of the plane parallel 46 can be found.

Figure 4:
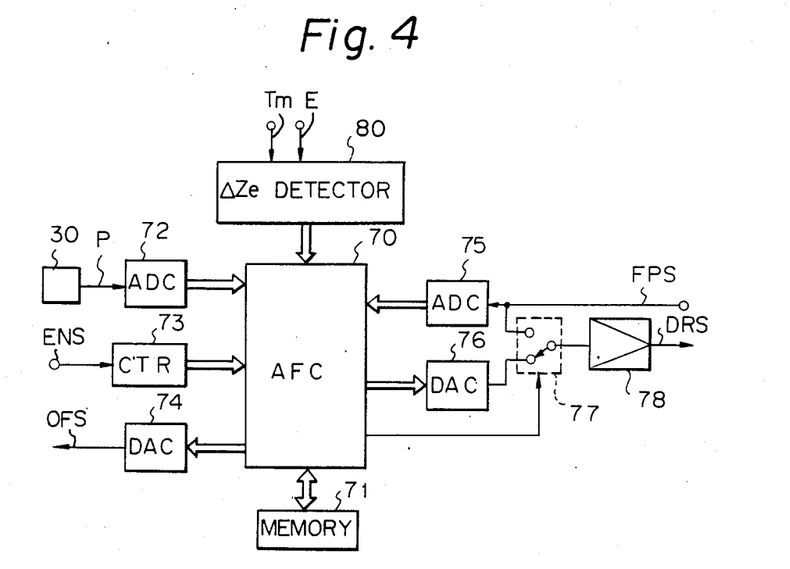
FIG. 4 is a circuit block diagram showing the construction of a correction control unit.

Now, FIG. 4 shows the schematic circuit construction of the correction control unit in the control circuit 22. Operation processing, sequence, etc. are generally controlled by an auto-focus controller (hereinafter referred to as AFC) 70 having a microcomputer or the like. A memory 71 stores therein various parameters, constants, etc. necessary for the correction operation, a program of operational equation, a program for sequence control, etc., and AFC 70 effects a series of operations in accordance with those programs, and reads the various parameters and constants as required.

The pressure sensor 30 shown also in FIG. 1 puts out a signal P indicative of the absolute value of the atmospheric pressure to an analog-digital converter (hereinafter referred to as ADC) 72. ADC 72 puts out a digital value corresponding to the signal P to AFC 70. Also, the signal ENS from the rotary encoder 54 shown in FIG. 3 is input to a counter 73, in which it is converted into a digital value and is put out to AFC 70. A digital-analog converter (hereinafter referred to as DAC) 74 receives as an input the corrected value operated by AFC 70 on the basis of the amount of fluctuation of the focus, and puts out its analog signal as an offset signal OFS.

Also, in order to effect the original automatic focusing operation, there are provided ADC 75 which receives the focus signal FPS as an input, DAC 76 which receives as an input the information of the amount of drive necessary to move the Z stage 4 upwardly or downwardly until the focus signal FPS represents the in-focus, a switch 77 for alternatively selecting the focus signal FPS and the output signal of DAC 76, and a servo circuit 78 for putting out a driving signal DRS to the motor which moves the Z stage 4 upwardly or downwardly on the basis of the signal selected by the switch 77 and effecting servo control. Even during the movement of the two-dimensionally movable stage, the switch 77 is changed over by AFC 70 so that the servo circuit 78 receives the forcus signal FPS as an input when the wafer is caused to follow the movement of the two-dimensionally movalbe stage so that the surface of the wafer is always brought into coincidence with the imaging plane FP.

Now, an illuminating light of high brightness enters the projection lens 2 through the reticle R. The quantity of light entering the projection lens 2 varies greatly dependently of the intensity of light of a lamp as an illuminating light source (the intensity of illumination on the reticle), the size of the pattern are Pr of the reticle R, the transmittance in the pattern area Pr and the ratio (duty) of the time during which the illuminating light is applied to the reticle R to the time during which the illuminating light is not applied to the reticle R. The fluctuation of the focus of the projection lens 2 is sometimes caused by the energy incident thereon.

So, in the present embodiment, another fluctuation detecting device 80 for detecting the amount of fluctuation of the focus caused by the energy incident on the projection lens 2 is provided so that both of the fluctuation of the focus caused by a variation in the refractive index of the atmosphere and the fluctuation of the focus caused by the incident energy can be corrected. AFC 70 adds the amount of fluctuation $\Delta Ze$ of the focus detected by the detector 80 to the amount of fluctuation $\Delta Zb$ of the focus caused by a variation in the refractive index of the atmosphere (a variation in atmospheric pressure) and finds an overall amount of fluctuation $\Delta F$.

Figure 5:
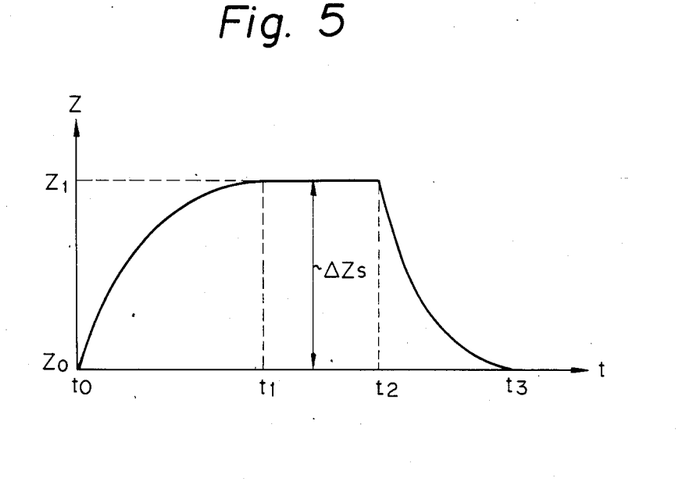
FIG. 5 is a graph showing the characteristic of the focus fluctuation by incident energy.

Now, it has been confined by an experiment that the characteristic of the fluctuation of the focus by the incident energy varies somewhat depending on the construction of the projection lens and the glass material used, but generally presents a characteristic like an exponential function as shown in FIG. 5. FIG. 5 shows the characteristic of the fluctuation of the focus when the illuminating light continuously enters the projection lens 2, with the atmospheric pressure as constant, and the abscissa thereof represents time t and the ordinate thereof represents the position Z of the imaging plane FP. If the illuminating light enters the projection lens 2 from time $t_0$ with the initial position of the imaging plane of the projection lens 2 as $Z_0$, the position of the imaging plane fluctuates in the fashion of an exponential function with time, and becomes stable at a predetermined position $Z_1$ at time $t_1$. This position $Z_1$ is the saturation point of the fluctuation corresponding to the then incident energy. When the incidence of the illuminating light is stopped at time $t_2$, the position of the imaging plane returns from $Z_1$ to the initial position in the fashion of an exponential function with time, and assumes the initial position $Z_0$ at time $t_3$. Assuming that the amount of fluctuation of the focus up to the saturation point in such a characteristic is $\Delta Zs$ it has become apparent from an experiment that the magnitude of $\Delta Zs$ naturally varies in proportion to the incident energy (the transmittance of the reticle R and the intensity of the illuminating light), but both of the time constant Tu of the rising from time $t_0$ to time $t_1$ and the time constant Td of the falling from time $t_2$ to time $t_3$ assume predetermined values inherent to the projection lens. These time constants are of the order of 300–600 although they differ depending on the type and structure of the projection lens. Accordingly, the amount of fluctuation $\Delta ZU$ of the rising portion in the characteristic of the fluctuation of the focus can be approximated by equation (1) below, and the amount of fluctuation $\Delta ZD$ of the falling portion can be approximated by equation (2) below.

$$\Delta ZU = \Delta Zs \cdot \left(1 - e^{-\frac{t}{Tu}}\right) \quad (1)$$

$$\Delta ZD = \Delta Zs \cdot e^{-\frac{t}{Tu}} \quad (2)$$

where e represnts a natural number, t in equation (1) is the lapse time when time $t_0$ is zero, and t in equation (2) is the lapse time when time $t_2$ is zero. Also, in the actual stepper, the wafer W is exposed by the step-and-repeat method and therefore, the duty of the opening and closing of the shutter provided in the illuminating optical device must be taken into consideration. That is, in the actual apparatus, due to the opening and closing of the shutter, the time until the fluctuation saturation point $\Delta Zs$ is reached becomes longer then the rising time $(t_1-t_0)$ in the case of continuous irradiation as shown in FIG. 5.

So, the detector 80 in the present embodiment is designed such that the incident energy information including the information of the opening and closing duty of the shutter and the information of the intensity of the illuminating light is indirectly detected by a temperature sensor and the transmittance E of the reticle R is discretely measured, whereby the amount of fluctuation $\Delta Ze$ of the focus by the energy incident on the projection lens 2 is operated. The detailed construction of the detector 80 is desclosed in U.S. application Ser. No. 749,438 filed by the applicant on June 27, 1985 and therefore will be briefly described herein.

Figure 6:
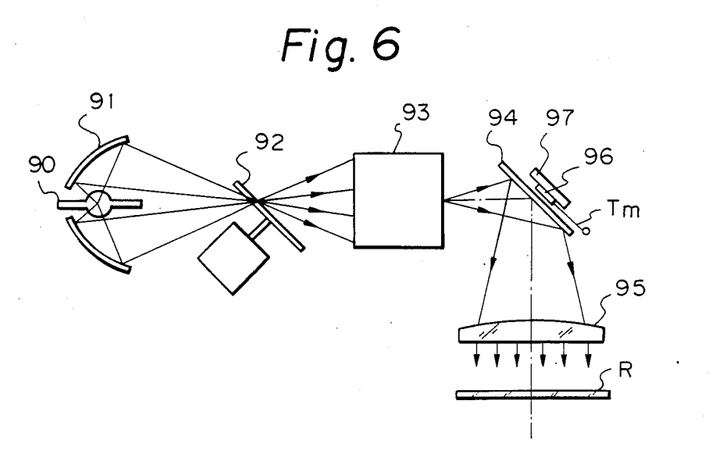
FIG. 6 is an optical arrangement illustration showing the construction of an illuminating optical device.

In FIG. 6, the illuminating light from a light source 90 and an elliptical reflecting mirror 91 is changed over to its intercepted state and its transmitted state by a rotary shutter 92, and enters an optical integrator 93. The light from the optical integrator 93 is reflected by a dichroic mirror 94 which transmits therethrough the other light than a light of a wavelength necessary for exposure, and illuminates the reticle R through a main condenser lens 95. On the back of the dichroic mirror 94, a temperature sensor 96 for receiving the transmitted light is held by a predetermined mount 97. The temperature sensor 96 and the mount 97 have their thermal time constants adjusted so that the time constant in the characteristc of a temperature signal Tm measured when the shutter 92 is opened to permit the illuminating light to continuously enter the projection lens 2 is coincident with the time constant in the characteristic of FIG. 5. Therefore, if the temperature signal Tm is monitored, the amount of fluctuation $\Delta Ze$ of the focus can be detected on real time irrespective of the exposure operation or the non-operation. The detector 80 shown in FIG. 4 receives the temperature signal Tm and the transmittance E of the reticle R as inputs, effects the operation of equation (3) below and finds the amount of fluctuation $\Delta Ze$ of the focus.

$$\Delta Ze = C_1 \cdot E \cdot (TM - Tm_o) \quad (3)$$

where $C_1$ represents the proportion constant of the amount of variation in temperature and the amount of fluctuation of the focus, $Tm_o$ represents the value of the temperature signal during the initial setting, this value having been found in advance by an experiment. The detector 80 stores therein said $C_1$, said $Tm_o$ and equation (3), finds $\Delta Ze$ from moment to moment by operation and puts out it to AFC 70.

Figure 7:
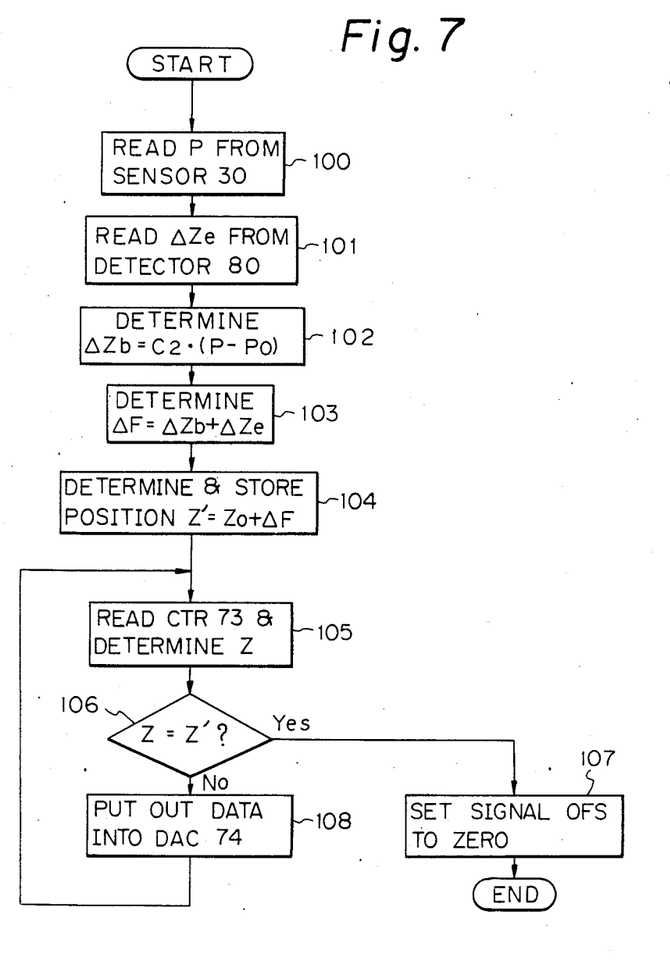
FIG. 7 is a flow chart illustrating the operation of focus fluctuation correction.

Operation of the present embodiment will now be described with reference to the flow chart of FIG. 7. The position Zo of the imaging plane actually measured in the case of the standard atmospheric pressure (e.g. 760 mmHg) Po during the manufacture of the apparatus is stored in the memory 71 connected to AFC 70. The position Zo actually is stored as the value read by the counter 73 shown in FIG. 4 (the position of the angle of rotation of the plane parallel 46). Steps for executing the operation of correction control will hereinafter be described.

Step 100

First, AFC 70 reads a signal P representing the then atmospheric pressure at an absolute value from the pressure sensor 30 through ADC 72 and temporily stores it.

Step 101

Then, AFC 70 reads from the detector 80 the information of the amount of fluctuation $\Delta Ze$ of the focus attributable to the incident energy at that point of time and stores it temporarily.

Step 102

Figure 8:
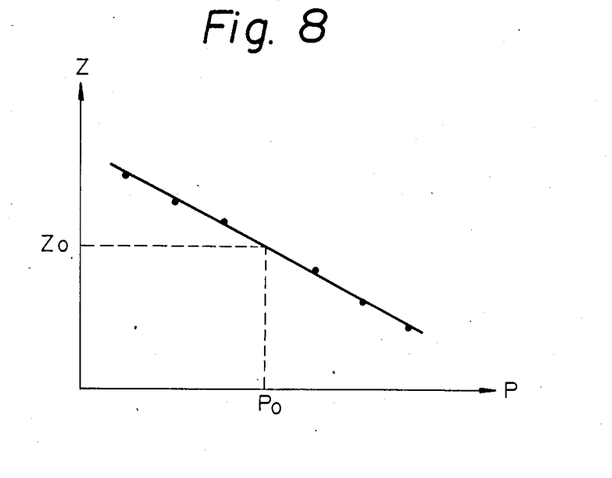
FIG. 8 is a graph showing the characteristic of the focus fluctuation by the atmospheric pressure.

Subsequently, AFC 70 calculates the amount of fluctuation $\Delta Zb$ of the focus attributable to a variation in the atmospheric pressure on the basis of equation (4) below.

$$\Delta Zb = C_2 \cdot (P - P_0) \quad (4),$$

where $C_2$ represents the proportion constant of the amount of variation in the atmospheric pressure and the amount of fluctuation of the focus, and the unit thereof is, for example, $\mu m/mmHg$. To determine this constant $C_2$, the position Z of the imaging plane in the cases of various atmospheric pressures may preferably be found by actual measurement. FIG. 8 shows the characteristic of the fluctuation of the focus of the projection lens 2 by a variation in the atmospheric pressure, and the abscissa of FIG. 8 represents the absolute value of the atmospheric pressure and the ordinate of FIG. 8 represents the position Z of the image plane.

Here, it is to be understood that the position Z becomes great when the imaging plane FP fluctuates so as to come close to the projection lens 2 side. As is apparent from the characteristic shown in FIG. 8, it has been confirmed by an experiment that the variation in atmospheric pressure and the fluctuation of the focus assume a simple proportional relation within the greatest possible range of fluctuation of the atmospheric pressure. From such a characteristic, the constant $C_2$ is obtained as the inclination of the straight line in FIG. 8 and is stored in AFC 70 in advance. The constant $C_2$ can be regarded as the same value with respect to any projection lens if the structure and glass material of the projection lens are the same. Strictly, however, it is desirable to determine the constant $C_2$ by actually measuring it with respect to each projection lens.

Step 103

Subsequently, AFC 70 finds the overall amount of fluctuation $\Delta F$ of the focus caused by the atmospheric pressure and the incident energy. This is calculated as the simple algebraic sum of the amounts of fluctuation $\Delta Zb$ and $\Delta Ze$.

Step 104

The amount of fluctuation $\Delta F$ of the focus is the amount of fluctuation with the initial position Zo as the reference and therefore, the target position $Z'$ of the imaging plane FP which is to be corrected can be found by $Z' = Zo + \Delta F$. AFC 70 effects that operation and stores the target position $Z'$.

Step 105

Subsequently, AFC 70 reads the value of the counter 73 corresponding to the current position of the angle of rotation of the plane parallel 46, and finds the current height position Z which the focusing detecting system judges as the in-focus.

Step 106

Here, AFC 70 compares the target position $Z'$ with the current position Z and, when the difference therebetween is zero (when they are coincident with each other), the program proceeds to step 107, and when there is a difference therebetween (when they are not coinccident with each other), the program proceeds to step 108.

Step 107

At this step, it is not necessary to correct the position of the angle of rotation of the plane parallel 46 and therefore, AFC 70 puts out to DAC 74 such data that the offset signal OFS becomes zero.

Step 108

At this step, it is necessary to rotate the plane parallel 46 and therefore, AFC 70 puts out the data for rotating the plane parallel 46 to DAC 74 so that the target position $Z'$ is obtained. Thus, the offset signal OFS corresponding to the difference between the target position $Z'$ and the current position Z is applied to the motor 54, whereby the plane parallel 46 begins to be rotated. When the offset signal OFS is produced at this step 108, AFC 70 again repeats a similar operation from step 105. When the plane parallel 46 is rotated until the target position $Z'$ is obtained, AFC 70 branches off from step 106 to step 107 and stops the rotation of the plane parallel 46.

Figure 9:
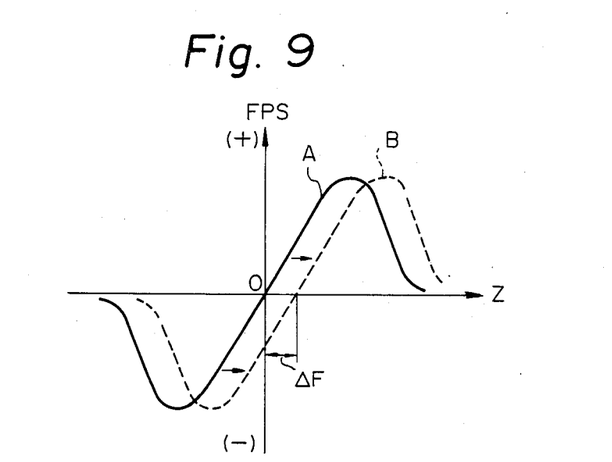
FIG. 9 is a graph showing the characteristic of the output of a synchronously rectified focus signal.

By the above-described series of operations, the in-focus of the focus detecting system and the height position to be detected are corrected, and the height position after thus corrected exactly coincides with the imaging plane FP of the projection lens 2. At this time, the output characteristic of the focus signal FPS from the focus detecting system varies as shown in FIG. 9. In FIG. 9, the abscissa represents the height position Z detected as the in-focus point by the focus detecting system and the ordinate represents the magnitude of the focus signal FPS. Assuming that the output characteristic (S curve characteristic) before corrected is a wave form A, the output characteristic after corrected is adjusted to a wave form B in which the wave form A has been shifted by $\Delta F$ in the direction of the Z-axis. Assuming that in the output characteristic, the position in Z-direction when the signal FPS is zero represents the in-focus point, the surface of the wafer W is focused to the zero point on the wave form B after the correction.

When said correction is terminated, AFC drives the motor 7 by ADC 75, DAC 76, the servo circuit 78, etc. and adjusts the height position of the Z stage 4 so that the wafer W is focused. Also, where only the fluctuation of the focus attributable to a variation in atmospheric pressure is to be corrected, if the steps 100-108 of FIG. 7 are executed once in a relatively long time, for example, every 10-30 minutes, there will be obtained a substantially sufficient follow-up property. However, where the fluctuation of the focus attributable to the incident energy during the step-and-repeat exposure is also to be corrected, it is necessary to execute the correcting operation once in a relatively short time, for example, every 5-10 seconds, except for the state in which that fluctuation of the focus can continuedly maintain the saturation point. This time interval must be sufficiently shorter than the time constant of the rising or the balling in the characteristic shown in FIG. 5, whereby the follow-up property of correction is improved.

Depending on the construction of the projection lens, it is sometimes possible that the fluctuation of the focus by the incident energy is smaller than the depth of focus of that lens and has little influence in practice. In such a case, the fluctuation of the focus by the energy incident on the projection lens 2 need not be taken into consideration, but the focus position is corrected simply on the basis of only the variation in the atmospheric pressure.

To detect the amount of fluctuation of the focus caused by the incident energy, several methods would occur to mind and some examples thereof will hereinafter be described briefly.

(1) A method in which the fluctuation characteristic of FIG. 5 is pre-stored as a table in a memory or the like because the characteristic of the fluctuation of the focus is regarded as the history of the incident energy, and how much energy has entered from the initial time during which the fluctuation of the focus is zero till the present is converted into an integration time found from the opening and closing duty of the shutter and the amount of fluctuation of the focus in the fluctuation characteristic corresponding to that integration time is searched from the table.

(2) A method in which a thin film resistance band is evaporated onto a lens element in a projection lens and the variation in temperature of the lens element or the temperature gradient of the lens surface is detected from the variation in the resistance value of the resistance band, whereby the fluctuation characteristic as shown in FIG. 5 is measured on real time.

(3) A method in which a linearly polarized thin probe light is caused to enter a projection lens and the probe light having emerged from the projection lens is photoelectrically detected through a polarizing plate whose angles of polarization are orthogonal to each other, whereby the variation in the double refractive index attributable to the energy incident on the projection lens is found to thereby measure the amount of fluctuation on real time from the correlation with the characteristic of the fluctuation of the focus.

Particularly, the methods mentioned under items (1) and (2) above can directly the amount of fluctuation of the focus which changes from moment to moment during the exposure operation, and this leads to an advantage that complicated control becomes unnecessary. The pressure sensor 30 for detecting the atmospheric pressure can be used not only to detect the fluctuation of the focus but also as an atmospheric pressure sensor for the automatic laser wavelength corrector (ALCP) of a laser interference measuring machine.

Also, in the present embodiment, correction of the fluctuation of the focus is accomplished by rotation of the plane parallel 46, but a similar effect may be obtained by moving the slit plate 48. Further, in the case of a construction in which the focus signal FPS is compared with a predetermined slice level and the point at which the signal FPS and the slice level are coincident with each other is judged as the in-focus position, a similar effect may be obtained if the relation between the slice level and the wave form of the focus signal FPS is imparted as an electrical offset value by an amount corresponding to the amount of fluctuation $\Delta F$ of the focus. However, such electrical offset is effective only in the straight portion of the wave form of the focus signal FPS, and cannot correspond to the offset (correction) great enough to exceed the straight portion. Also, where the servo range is determined about the slice level, that range becomes asymmetrical. Combination (hybrid) control is also possible in which relatively great offset is coped with by the rotation of the plane parallel and the fine adjustment of the offset is electrically coped with.

Now, in the above-described embodiment, it is for the purpose of binding the refractive index of the air that the atmospheric pressure is detected and therefore, instead of detecting the atmospheric pressure, the refractive index of the air may be directly detected. As the means for detecting the refractive index of the air, mention may be made, for example, of means whereby a light of stable frequency such as the output light of a frequency stabilizing laser is caused to enter a Michelson interferometer having a stable optical path difference and the refractive index of the light under a certain atmospheric condition is found from the variation in a light interference signal in a state in which the optical path of the interferometer is rendered vacuum and a state in which the air is introduced into said optical path to thereby bring about the atmospheric pressure. If the refractive index is directly detected in this manner, correction of higher accuracy than the detection of the atmospheric pre pressure is possible.

As the factor which varies the refractive index of the atmosphere, a variation in the atmospheric pressure is dominant. However, a variation in the proportion between the components in the atmosphere (oxygen, nitrogen, carbon dioxide, etc.) and a variation in the temperature of the atmosphere also affect the refractive index of the atmosphere, though slightly. Further, as the focus detecting system incorporated in the exposure apparatus of this type, use is also made of a gap sensor in which gas is injected to the surface of the wafer from a nozzle provided on the barrel side of the projection lens and the variation in the back pressure thereof is measured by a pressure-displacement converter and a displacement-electric converter to thereby detect the spacing between the projection lens (nozzle) and the wafer, i.e., a so-called air micrometer. In the case of such an air micrometer, the nozzle is made movable in the direction of the optic axis relative to the lens barrel and offset is mechanically imparted or offset is electrically imparted to the measured detection signal, whereby the correction control of the fluctuation of the focus is possible.

We claim:

1. An apparatus for forming the optical image of a photo-pattern placed on a first plane on a second plane, comprising:
    projection means having a projection optical system disposed between said first plane and said second plane to form said optical image;
    focus detecting means including means for detecting the position of said second plane relative to said projection optical system, the in-focus position corresponding to the position of said second plane when the imaging plane of said projection optical system and said second plane are coincident with each other and being preset, said focus detecting means putting out a detection signal when said in-focus position is detected by said detecting means;
    fluctuation detecting means for determining the amount of fluctuation of the imaging plane of said projection optical system caused correspondingly to a variation in the refractive index of the atmosphere; and
    means responsive to said fluctuation detecting means to control said focus detecting means so that said in-focus position is re-set correspondingly to the amount of fluctuation of said imaging plane determined by said fluctuation detecting means.

2. An apparatus according to claim 1, further comprising means for adjusting the spacing between said projection optical system and said second plane on the basis of the detection signal of said focus detecting means.

3. An apparatus according to claim 1, wherein said fluctuation detecting means includes a pressure sensor for measuring the atmospheric pressure and determines the amount of fluctuation of said imaging plane on the basis of a variation in the atmospheric pressure.

4. An apparatus according to claim 3, wherein said projection means includes illuminating means for causing an illuminating energy beam to enter said projection optical system through said first plane, and said fluctuation detecting means further includes means for determining the amount of fluctuation of said imaging plane caused by the incidence of said energy beam and means for adding the amount of fluctuation of said imaging plane based on said variation in the atmospheric pressure and the amount of fluctuation of said imaging plane based on the incidence of said energy beam.

5. An apparatus according to claim 1, wherein said focus detecting means has means for emitting a measuring beam obliquely incident on said second plane and a detector disposed on the optical path of the measuring beam reflected on said second plane, and said control means includes means for changing the optical path of said measuring beam.

6. An apparatus for forming the optical image of a photo-pattern placed on a first plane on a second plane, comprising:
    projection means having a projection optical system disposed between said first plane and said second plane to form said optical image;
    focus detecting means including means for detecting the position of said second plane relative to said projection optical system, the in-focus position corresponding to the position of said second plane when the imaging plane of said projection optical system and said second plane are coincident with each other and being preset, said focus detecting means putting out a detection signal when said in-focus position is detected by said detecting;

means including means for measuring the atmospheric pressure, said means re-setting the preset in-focus position of said focus detecting means to correct the fluctuation of the imaging plane of said projection optical system varying correspondingly to the atmospheric pressure; and means for adjusting the spacing between said projection optical system and said second plane. on the basis of the detection signal of said focus detecting means.

7. An apparatus according to claim 6, wherein said re-setting means includes means for determining the amount of fluctuation of said imaging plane on the basis of a variation in said atmospheric pressure.

8. An apparatus according to claim 7, wherein said projection means includes illuminating means for causing an illuminating energy beam to enter said projection optical system through said first plane, and said re-setting means further includes means for determining the amount of fluctuation of said imaging plane caused by the incidence of said energy beam and means for adding the amount of fluctuation of said imaging plane based on said variation in the atmospheric pressure and the amount of fluctuation of said imaging plane based on the incidence of said energy beam.

9. An apparatus according to claim 6, wherein said focus detecting means has means for emitting a measuring beam obliquely incident on said second plane and a detector disposed on the optical path of the measuring beam reflected on said second plane, and said re-setting means includes means for changing the optical path of said measuring beam.

10. An apparatus for forming the optical image of a photo-pattern placed on a first plane on a second plane, comprising:

projection means having a projection optical system disposed between said first plane and said second plane to form said optical image;

focus detecting means including means for detecting the position of said second plane relative to said projection optical system, the best focus position corresponding to the position of said second plane when the imaging plane of said projection optical system and said second plane are coincident with each other and being preset, said focus detecting means putting out a detection signal corresponding to the deviation of said second plane from said best focus position;

fluctuation detecting means for determining the amount of fluctuation of the imaging plane of said projection optical system caused correspondingly to a variation in the refractive index of the atmosphere; and means responsive to said fluctuation detecting means to control said focus detecting means so that said best focus position is re-set correspondingly to the amount of fluctuation of said imaging plane determined by said fluctuation detecting means.

11. An apparatus according to claim 10, further comprising means for adjusting the spacing between said projection optical system and said second plane on the basis of the detection signal of said focus detecting means.

12. An apparatus according to claim 10, wherein said fluctuation detecting means includes a pressure sensor for measuring the atmospheric pressure and determines the amount of fluctuation of said imaging plane on the basis of a variation in the atmospheric pressure.

13. An apparatus according to claim 12, wherein said projection means includes illuminating means for causing an illuminating energy beam to epter said projection optical system through said first plane, and said fluctuation detecting means further includes means for determining the amount of fluctuation of said imaging plane caused by the incidence of said energy beam and means for adding the amount of fluctuation of said imaging plane based on said variation in the atmospheric pressure and the amount of fluctuation of said imaging plane based on the incidence of said energy beam.

14. An apparatus according to claim 10, wherein said focus detecting means has means for emitting a measuring beam obliquely incident on said second plane and a detector disposed on the optical path of the measuring beam reflected on said second plane, and said control means includes means for changing the optical path of said measuring beam.

15. An apparatus for forming the optical image of a photo-pattern placed on a first plane on a second plane, comprising:

projection means having a projection optical system disposed between said first plane and said second plane to form said optical image;

focus detecting means including means for detecting the position of said second plane relative to said projection optical system, the best focus position corresponding to the position of said second plane when the imaging plane of said projection optical system and said second plane are coincident with each other and being preset, said focus detecting means putting out a detection signal corresponding to the deviation of said second plane from said best focus position;

means including means for measuring the atmospheric pressure, said means re-setting the preset best focus position of said focus detecting means to correct the fluctuation of the imaging plane of said projection optical system varying correspondingly to the atmospheric pressure; and means for adjusting the spacing between said projection optical system and said second plane on the basis of the detection signal of said focus detecting means.

16. An apparatus according to claim 15, wherein said re-setting means includes means for determining the amount of fluctuation of said imaging plane on the basis of a variation in said atmospheric pressure.

17. An apparatus according to claim 16, wherein said projection means includes illuminating means for causing an illuminating energy beam to enter said projection optical system through said first plane, and said re-setting means further includes means for determining the amount of fluctuation of said imaging plane caused by the incidence of said beam and means for adding the amount of fluctuation of said imaging plane based on said variation in the atmospheric pressure and the amount of fluctuation of said imaging plane based on the incidence of said energy beam.

18. An apparatus according to claim 15, wherein said focus detecting means has means for emitting a measuring beam obliquely incident on said second plane and a detector disposed on the optical path of the measuring beam reflected on said second plane, and said re-setting means includes means for changing the optical path of said measuring beam.

19. An apparatus for forming the optical image of an object placed on a first plane on a second plane, comprising:
projection means having a projection optical system disposed between said first plane and said second plane to form said optical image;
means for detecting the position of said second plane relative to said projection optical system, said detecting means being preset to a best focus position corresponding to the position of said second plane when the imaging plane of said projection optical system and said second plane are coincident with each other;
means for measuring the atmospheric pressure; and
means for re-setting the preset best focus position of said detecting means to correct the fluctuation of the imaging plane of said projection optical system varying correspondingly to the atmospheric pressure.

20. An apparatus according to claim 19, wherein said detecting means generates a detection signal indicating a positional relation between said second plane and said best focus position.

21. An apparatus for forming the optical image of an object placed on a first plane on a second plane, comprising:
projection means having a projection optical system disposed between said first plane and said second plane to form said optical image;
means for detecting the position of said second plane relative to said projection optical system;
means for measuring the atmospheric pressure to determine the amount of fluctuation of the imaging plane of said projection optical system; and
means for determining the deviation of said second plane from said imaging plane in accordance with said detecting means and said measuring means.

22. An apparatus according to claim 21 further comprising means for adjusting the spring between said projection optical system and said second plane in response to said determining means.

* * * * *